United States Patent
Endo et al.

(10) Patent No.: US 6,846,743 B2
(45) Date of Patent: Jan. 25, 2005

(54) METHOD FOR VAPOR DEPOSITION OF A METAL COMPOUND FILM

(75) Inventors: Kazuhiko Endo, Minato-ku (JP); Motofumi Saitoh, Minato-ku (JP)

(73) Assignee: NEC Corporation, Tokyo (JP)

( * ) Notice: Subject to any disclaimer, the term of this patent is extended or adjusted under 35 U.S.C. 154(b) by 263 days.

(21) Appl. No.: 10/147,977

(22) Filed: May 20, 2002

(65) Prior Publication Data

US 2002/0172768 A1 Nov. 21, 2002

(30) Foreign Application Priority Data

May 21, 2001 (JP) ........................................ 2001-150289

(51) Int. Cl.[7] ............................................. H01L 21/44
(52) U.S. Cl. ...................... 438/681; 438/769; 438/770; 438/775
(58) Field of Search .................... 438/680, 681, 438/769, 770, 775, 788–794, 591, 760, 785, 787

(56) References Cited

U.S. PATENT DOCUMENTS

| | | | | |
|---|---|---|---|---|
| 5,827,802 A | * | 10/1998 | Lagues | ........................ 427/377 |
| 6,482,740 B2 | * | 11/2002 | Soininen et al. | ............ 438/686 |
| 6,511,539 B1 | * | 1/2003 | Raaijmakers | ................ 117/102 |
| 6,521,911 B2 | * | 2/2003 | Parsons et al. | ................ 257/52 |
| 6,548,424 B2 | * | 4/2003 | Putkonen | .................... 438/785 |
| 6,620,670 B2 | * | 9/2003 | Song et al. | ................. 438/216 |
| 6,669,825 B2 | * | 12/2003 | Ohmi et al. | ................. 427/331 |

OTHER PUBLICATIONS

H. J. Osten et al. "High–k Gate Dielectrics with Ultra–low Leakage Current Based on Praseodymium Oxide", IEDM Technical Digests 2000, pp. 653–656 with Abstract.

L. Manchanda et al., "Si–Doped Aluminates for High Temperature Metal–Gate CMOS: Zr–Al–Si–O, A Novel Gate Dielectric for Low Power Applications", IEDM Technical Digests 2000, pp. 23–26 with Abstract.

* cited by examiner

Primary Examiner—Kevin M. Picardat
(74) Attorney, Agent, or Firm—Sughrue Mion, PLLC

(57) ABSTRACT

A method for forming a metal compound film includes alternate irradiation of an organometal compound and oxygen or nitrogen radicals to deposit monoatomic layers of the metal compound. The organometal compound includes zirconium, hafnium, lanthanide compounds. The resultant film includes little residual carbon and has excellent film characteristic with respect to leakage current.

13 Claims, 10 Drawing Sheets

SATURATION ABSORPTION OF $HfO_2$ BY WATER

METHOD FOR VAPOR DEPOSITION OF A METAL COMPOUND FILM

BACKGROUND OF THE INVENTION (a) Field of the Invention

The present invention relates to a method for vapor deposition of a metal compound film in a semiconductor device and, more particularly, to a method for deposition of a metal oxide or metal nitride film by depositing monoatomic layers thereof one on another in a semiconductor device.

(b) Description of the Related Art

Along with the recent development of higher integration of LSIs, it is an important subject on the fabrication of LSIs to form a variety of thin films with excellent reliability and uniformity on a silicon wafer. In particular, it is desired that the gate insulating film underlying the gate electrode of a MOSFET have lower leakage current, higher withstand voltage, higher reliability, and uniformity of film thickness. Dielectric films made of $SiO_2$-based material are generally used as the gate insulating films heretofore, and are formed by a thermal oxidation process. On top of the gate insulating film, a polysilicon electrode is generally formed as the gate electrode by using a low pressure CVD (LPCVD) technique.

In the circumstances as described above, the gate insulating film has a thickness as small as 2 nm or less in consideration of the scaling rule of the up-to-date MOSFETs. Such a small thickness of the gate insulating film involves a problem of increase in the gate leakage current. For solving this problem, introduction of metal oxide dielectric films having a higher dielectric constant than the $SiO_2$ film is actively studied. This is considered because the effective film thickness in terms of the thickness of $SiO_2$ film having a dielectric constant of 4.0 can be reduced for an insulating film, if the insulating film has a higher dielectric constant, to obtain an equal insulating capability for suppressing the leakage current.

The metal compound dielectric film should be thermodynamically stable in relation to silicon, and thus introduction of $Al_2O_3$, $ZrO_2$, $HfO_2$, lanthanide oxides etc. is considered (refer to, for example, "IEDM Technical Digests 2000", 653 pp by H. J. Osten). Among others, an $Al_2O_3$ film is generally expected as an excellent dielectric film for replacing the $SiO_2$ film because the $Al_2O_3$ film has been used heretofore as an insulating film. However, the dielectric constant of $Al_2O_3$ is moderate and resides around 10.0. Thus, materials having higher-dielectric constants such as $ZrO_2$ having a dielectric constant of 25, a $HfO_2$ having a dielectric constant of 30 and lanthanide materials are studied for forming the next-generation insulating films. In alternatives, an aluminate film, wherein $Al_2O_3$ film is added with zirconium (Zr) or hafnium (Hf), and a silicate film, wherein $SiO_2$ film is added with Zr or Hf, are also expected as the next-generation insulating films (refer to, for example, "IEDM Technical Digests 2000", 23 pp, by L. Manchanda).

On the other hand, in deposition of a gate insulating film, it is especially important to assure the in-plane uniformity of the film thickness within the wafer. For example, the in-plane uniformity of the film thickness is required to reside within ±5 nm in the case of forming a gate insulating film having a thickness of 1.5 nm in terms of the $SiO_2$ thickness.

In the deposition of the higher-dielectric-constant gate insulating films, among a variety of conventional processes such as reactive sputtering, thermal oxidation treatment after metal sputtering, and CVD (chemical vapor deposition), an atomic layer deposition (ALD) technique has attracted large attention due to the excellent in-plane uniformity of the film thickness within the wafer. The ALD technique is such that metal oxide is vapor-deposited by stacking monoatomic layers thereof one on another. For deposition of the metal oxide film by using the ALD technique, alternate irradiation of trimethylaluminum (TMA) and water is used in the case of $Al_2O_3$, and alternate irradiation of a chloride material and water is used in the case of $ZrO_2$ or $HfO_2$.

In the conventional ATM technique for deposition of $ZrO_2$ or $HfO_2$, there is a problem in that the chloride used as the source gas remains in the resultant film. The residual chloride remaining in the deposited film degrades the reliability of the semiconductor device during the succeeding processes. In the case of an aluminate film or a silicate film including Zr or Hf, a chloride is also used as the source material, which involves a similar problem. In the case of introduction of lanthanide materials, the chloride used as the source material is solid and it is difficult to deposit this source material by using a vapor deposition technique.

SUMMARY OF THE INVENTION

In view of the above, it is an object of the present invention to provide a method for vapor deposition of metal compound such as zirconium or hafnium oxide, zirconium or hafnium nitride, aluminate or silicate including these materials, or oxide of lanthanide on a substrate by using an ALD technique, to thereby form a thin film having excellent film properties with excellent uniformity, without using chloride materials.

The present invention provides a method for depositing monoatomic layers of a metal compound to form a metal compound film on a substrate, including the step of irradiating alternately an organometal compound as a source material and either of oxygen radicals, nitrogen radicals and a mixture of oxygen radicals and nitrogen radicals as an oxidizing or nitriding agent.

By using the organometal compound instead of a chloride, the resultant metal compound film does not substantially include residual chlorine so that the resultant film has excellent film properties. By using the oxidizing radicals or nitriding radicals instead of water that is conventionally used, the reaction between water and the organometal compound is suppressed to effectively stack the metal compound monoatomic layers one on another.

In a preferred embodiment of the present invention, the organometal compound is selected from the compounds of zirconium, hafnium and lanthanide as a source material, which is used in association with oxygen radicals, nitrogen radicals or a mixture thereof to deposit a metal compound film. The source material and the radicals are alternately irradiated to stack monoatomic layers of the metal compound one on another, under the conditions that the partial pressure of water is $10^{-4}$ Pa or below and the substrate temperature is 300 degrees C. or below.

More specifically, by iterating the step of irradiation of organometal compound for saturation absorption deposition, and the step of irradiation of oxygen radicals instead of water to oxidize the organometal compound saturation-absorbed on the substrate for removal of carbon therefrom, metal compound monoatomic layers are stacked one on another. By using nitrogen radicals instead of oxygen radicals, a metal nitride film is obtained as stacked monoatomic layers, whereas by using a mixture of oxygen radicals and nitrogen radicals, a metal oxide nitride film is obtained as stacked monoatomic layers.

The term "monoatomic layers" as used in the present invention need not be strict monoatomic layers during the deposition, and it is sufficient that the resultant metal compound film is obtained as the combination of organometal layers saturation-absorbed on the substrate in respective irradiation cycles of the source material. The influence by the steric hindrance due to the sizes of the absorbed organometal compound changes the thickness of each stacked metal compound layer into the thickness substantially equal to the thickness of the monoatomic layer or lower.

The above and other objects, features and advantages of the present invention will be more apparent from the following description, referring to the accompanying drawings.

PREFERRED EMBODIMENTS OF THE INVENTION

It is preferable in the present invention that the oxygen radicals be prepared from oxygen gas, the nitrogen radicals be prepared from nitrogen gas or ammonia gas, and the mixture of oxygen radicals and nitrogen radicals be prepared from nitrogen oxide gas such as including NO, $N_2O$ and/or $NO_2$.

It is also preferable that partial pressure of water within the deposition chamber be maintained at $10^{-4}$ Pa or below during deposition of the metal compound film, to suppress reaction between water and the organometal compound.

It is also preferable that the substrate temperature is maintained at a temperature at which autolysis of the organometal compound does not occur. For example, the substrate temperature is preferably maintained at a temperature range within which the organometal compound is deposited in an amorphous state. The substrate temperature may be maintained between room temperature and 300 degrees C. if tertiarybutoxyhafnium is sued as the organometal compound.

In a specific example of the present invention, the step of irradiating oxygen radicals or nitrogen radicals onto a silicon substrate to form a silicon oxide film or silicon nitride film and the step of depositing the organometal compound film may be successively and iteratively performed in a deposition chamber.

In another specific example, the metal compound film may be formed by using, as a source material, a mixture of a plurality of organometal compounds while changing the mixing ratio therebetween, to control the composition of the resultant metal compound film.

Examples of the organometal compound preferably include zirconium, hafnium or lanthanide compounds.

The deposition method of the present invention is preferably used for forming a gate insulating film in a MOSFET and a barrier metal film in an multilayer interconnection film.

In the deposition, tetradimethylaminotitanium may be used as the organometal compound in association with irradiation of nitrogen radicals to form a TiN barrier layer. In an alternative, pentadimethylaminotantalum may be used as the organometal compound in association with irradiation of nitrogen radicals to form a TaN barrier layer.

Now, the present invention is more specifically described with reference to accompanying drawings, wherein similar constituent elements are designated by similar reference numerals.

Figure 1:
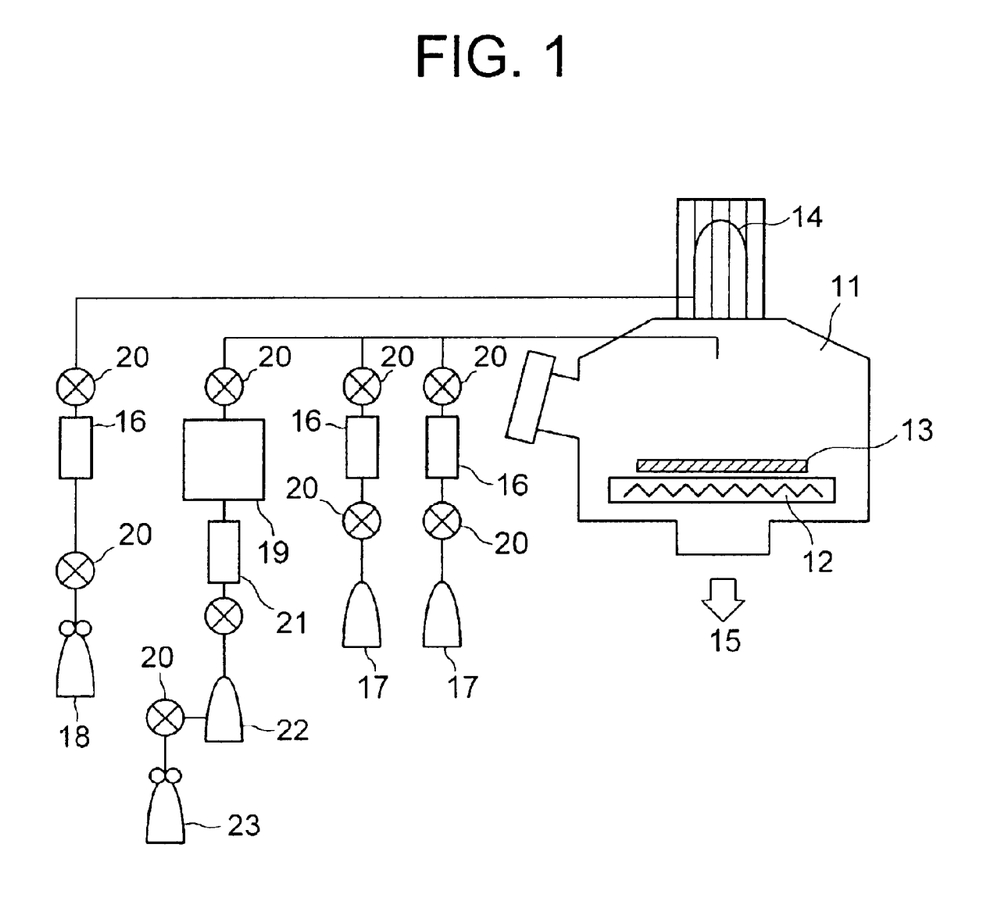
FIG. 1 is a schematic block diagram of a vapor deposition system using a method according to an embodiment of the present invention.

Referring to FIG. 1, a vapor deposition system using a method according to an embodiment of the present invention includes a deposition chamber 11 maintained at vacuum by using a vacuum pump 15 such as a dry pump or drag molecular pump. The base degree of vacuum is $10^{-5}$ Pa or lower, and the partial pressure of water is maintained at $10^{-4}$ Pa or lower at any time within the deposition chamber 11. A radical source 14 provided at the top of the deposition chamber 11 is applied with a microwave to irradiate oxygen or nitrogen radicals toward the bottom. The radical source 14 is coupled to an oxygen/nitrogen cylinder 18 via stop valves 20 and a mass flow controller 19.

In the vapor deposition system, the source material, or the organometal compound, can be supplied by using two different lines. First, a liquid organometal compound received in a source cylinder 17 is heated up to a specified temperature to have a higher vapor pressure, then introduced by means of the mass flow controller 16 to the deposition chamber 11. Second, a liquid organometal compound is vaporized by using a carburetor 19 and introduced into the deposition chamber 11 while controlling the flow rate of the liquid organometal compound by using a liquid mass flow controller 19. The liquid source material is supplied from a liquid source cylinder 22 by using a helium gas cylinder 23. If the source material has a higher vapor pressure and thus the vapor pressure thereof is easily raised by heating, the first line having the mass flow controller 16 is used, whereas if the source material has a lower vapor pressure and thus the vapor pressure thereof is hardly raised by heating, the second line having the carburetor 19 is used. The deposition system is provided with a heater 12 for heating the substrate 13.

Examples of the metal compound film were formed by the deposition system as described above. By using a method of a comparative example similar to the conventional method except for the source material which was organometal compound instead of the chloride, insulating films were formed. More specifically, the comparative example used tertiarybutoxyhafnium, $Hf(OtBu)_4$, as the source material and water instead of the oxidizing radicals. By irradiating alternately the source material and water, deposition of monoatomic layers was attempted under the conditions wherein the substrate temperature is 300 degrees C., partial pressure at each irradiation cycle was 100 Pa, and the time lengths for irradiation of water and hafnium were 5 seconds and 30 seconds, respectively.

Figure 2:
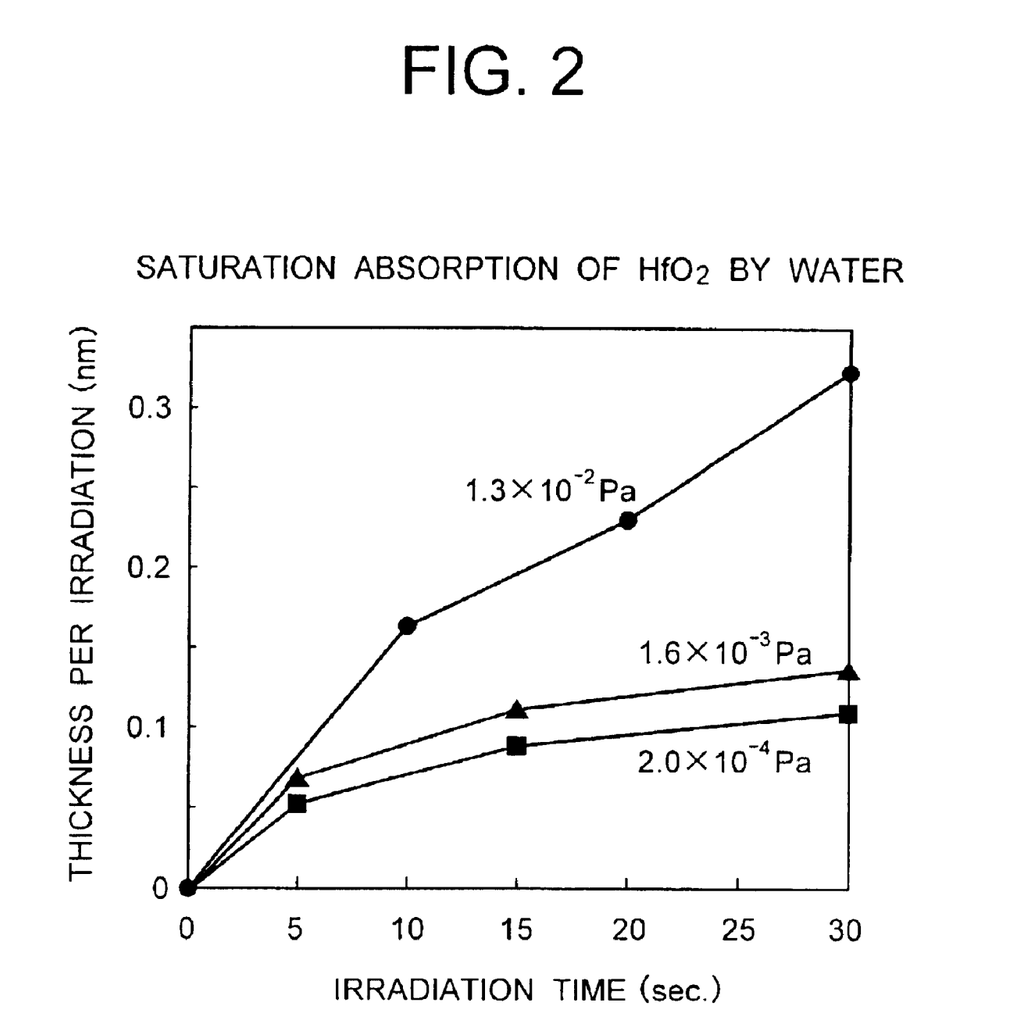
FIG. 2 is a graph showing the relationship between the layer thickness of each irradiation cycle and the time length for each irradiation of the source material, in a comparative process using alternate irradiation of organometal compound and water.

FIG. 2 shows the absorption characteristic of $HfO_2$ obtained in the above comparative example, wherein the thickness of the film deposited in each cycle is plotted against the time length for each irradiation cycle of the source material, with the partial pressure of water being a parameter. As understood from FIG. 2, the thickness of the film deposited in each cycle increased with the increase of the time length for each irradiation without saturation. This means that the tertiarybutoxyde was not saturation-absorbed on the substrate, and in fact was deposited by ordinary vapor deposition. Although a lower partial pressure of water may suppress the reaction between water and the source organometal compound to allow the saturation absorption to occur, as understood from FIG. 2, it is extremely difficult to reduce the partial pressure of water for obtaining effective saturation absorption, even if a large-scale deposition chamber is used or a hot wall is provided in the deposition chamber. Thus, it is concluded that a mere replacement of chloride by organometallic compound does not provide effective deposition of monoatomic layers of a metal compound.

Thus, the process of the present invention uses oxygen radicals, nitrogen radicals, or mixture thereof instead of water in addition to replacement of metal chloride by a source material, the organometal compound, as described in the examples recited hereinafter.

EXAMPLE #1

This example is directed to deposition of monoatomic layers of hafnium oxide.

Tertiarybutoxyhafnium, i.e., $Hf(OtBu)_4$, was used as a source material of hafnium. The substrate 13 used therein was an 8-inch silicon substrate, which had thereon a thermal oxide film having a thickness of 1 nm or smaller and formed beforehand. The source material was heated up to about 80 degrees C., and introduced into the deposition chamber 11 by way of the mass flow controller 16. The partial pressure of the irradiated tertiarybutoxyed was 100 Pa, whereas the oxygen radicals were generated at an oxygen partial pressure of 1 Pa by applying thereto an electric power of 10 watts. After the substrate was heated up to 300 degrees C., the source material and the oxygen radicals were irradiated alternately in this order for 40 cycles.

Figure 3:
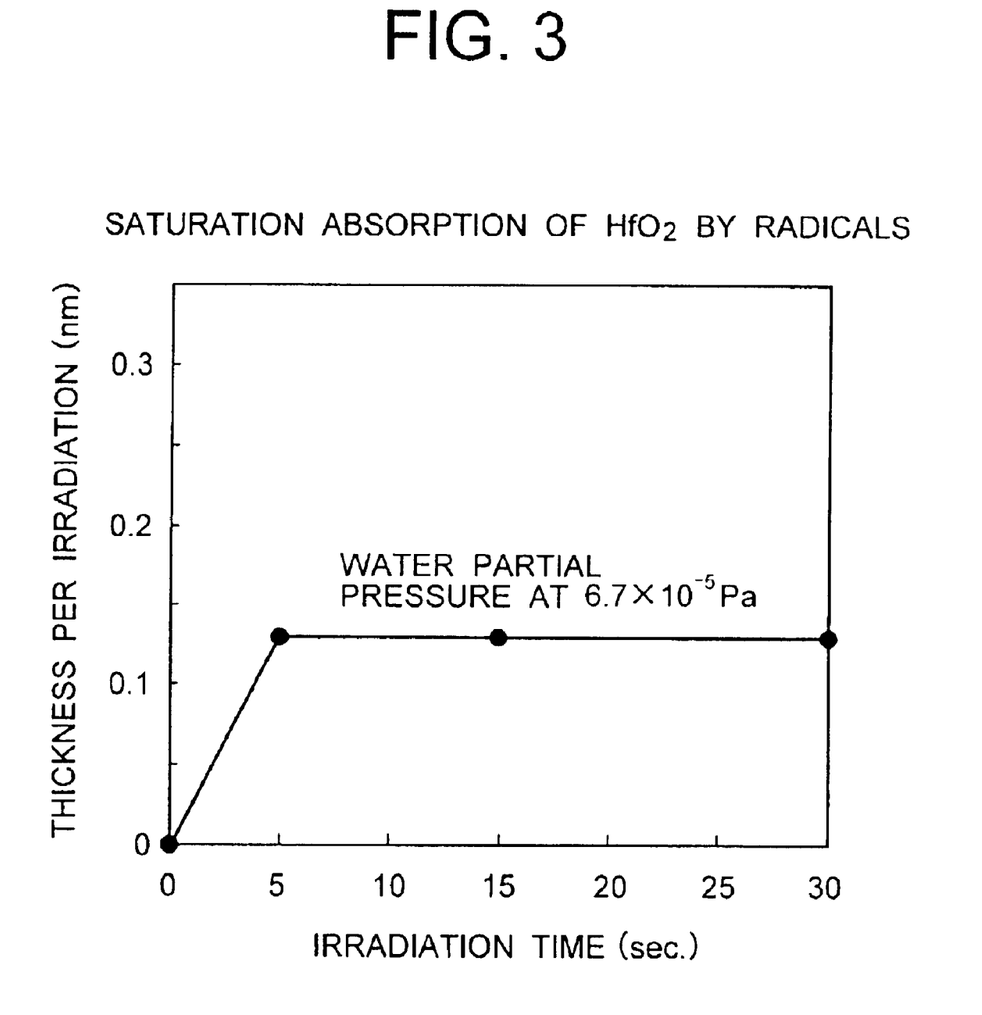
FIG. 3 is a graph showing the relationship between the layer thickness of each cycle and the time length for each irradiation of the source material in the process using alternate irradiation of organometal compound and oxygen radicals according to the present invention.

FIG. 3 shows the relationship between the film thickness deposited per each cycle of irradiation and the time length of each irradiation of the source material. As understood from this graph, the source organometal compound is saturation-absorbed onto the substrate by a process using a time length of 5 seconds or above for each irradiation of the source material in the alternate irradiation of the source material and the oxygen radicals. This means that deposition of the monoatomic layers is achieved for the organometal compound by using the same in association with the oxygen radicals as an oxidizing agent.

Figure 4A:
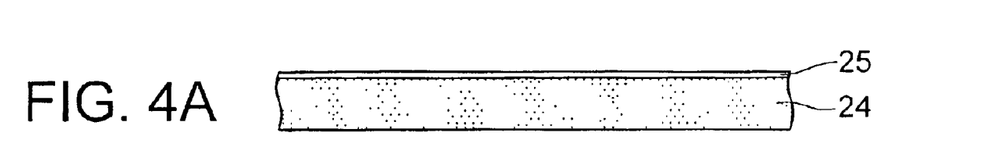
FIGS. 4A to 4C show consecutive steps in a saturation absorption process.
Figure 4B:
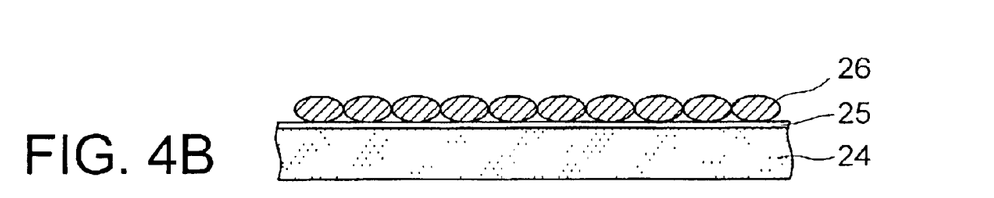
Figure 4C:
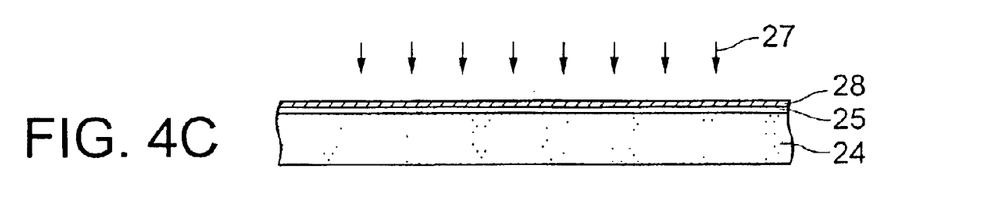

Referring to FIGS. 4A to 4C, there are shown consecutive steps of the saturation absorption, which is considered to have occurred in the example #1. In FIG. 4A, a silicon oxide film 25 is first formed on the silicon substrate 24 by oxidation performed by the oxygen radicals. Subsequently, the organometal compound 26 is saturation-absorbed on the silicon oxide film 25, as shown in FIG. 4B. If the organometal compound 26 deposited on the silicon oxide film 25 is not subjected to autolysis thereof, then the amount of the source material absorbed in each irradiation cycle remains constant. Thereafter, oxygen radicals 27 are irradiated to oxidize the saturation-absorbed organometal compound, as shown in FIG. 4C, whereby a single metal oxide monoatomic layer 28 is obtained. The thickness of the monoatomic layer 28 depends on the size of the saturation-absorbed organometal compound 26, and is comparable to the thickness of a single monoatomic layer of the organometal compound or less in the strict sense of the meaning. By iterating the alternate irradiation of the source material and oxygen radicals, a metal oxide film having a desired thickness can be obtained.

In the example #1, the partial pressure of water was maintained below $10^{-4}$ Pa, i.e., $6.7 \times 10^{-5}$ Pa as shown in FIG. 3, whereby the vapor reaction of the source material and water was suppressed because water was not used for the deposition. In addition, since the residual oxygen and the source material were not reacted in a vapor reaction during the irradiation of the source material, and since the oxygen radicals were substantially completely inactivated, reaction between the oxygen radicals and the source material could be avoided.

The deposition of monoatomic layers one on another in the example #1 improved the in-plane controllability of the thickness of the metal oxide film. For example, the variances of the thickness of the hafnium oxide film obtained by 40 cycles of alternate irradiation were maintained within ±0.05 nm from a desired thickness of 3 nm in an 8-inch wafer. The absence of chloride in the source material prevented the characteristic degradation during the succeeding processes.

Figure 5:
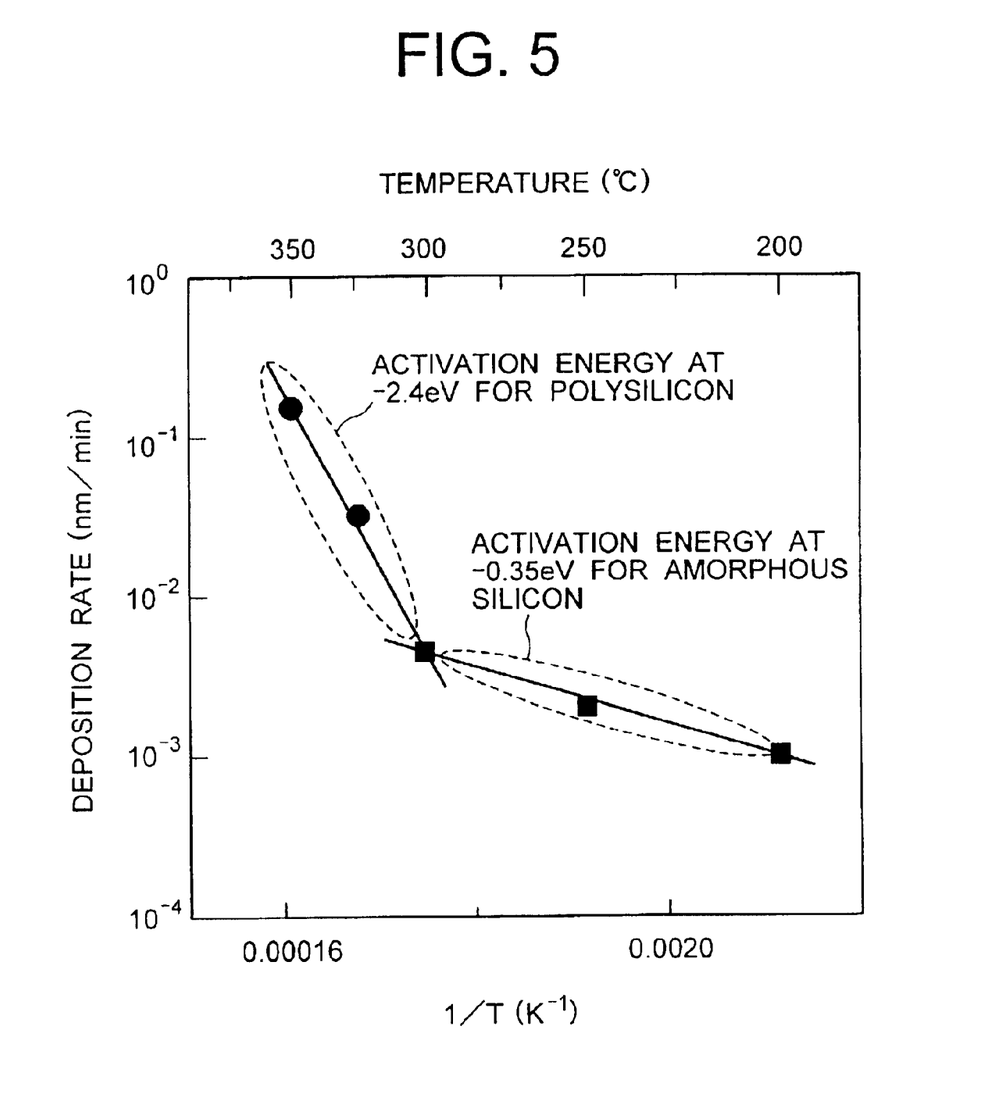
FIG. 5 is a graph showing the relationship between the substrate temperature and the deposition rate.

In an alternative deposition, wherein the substrate temperature was maintained at 350 and 400 degrees C. instead of 300 degrees C., the source material was subjected to intense autolysis thereof so that deposition of monoatomic layers could not be obtained. FIG. 5 shows the relationship between the deposition rate and the substrate temperature obtained in this alternative example, wherein the deposition rate increased moderately with the rise of temperature below 300 degrees C. whereas the deposition rate increased abruptly with the rise of temperature above 300 degrees C. This is considered due to the intense autolysis of the deposited source material, which allowed an ordinary CVD growth to proceed even in the absence of the oxygen radicals.

It was confirmed from the film structure and the activation energies in respective ranges of temperature that the deposited film had an amorphous state when formed at temperatures below 300 degrees C. wherein the saturation absorption occurred, and that the deposited film had a polycrystalline structure when formed at temperatures above 300 degrees C. wherein intense autolysis is accompanied with the deposition. These results mean that, in order to deposit monoatomic layers according to the present invention, the deposition temperature should be 300 degrees C. or lower if the deposited film has an amorphous state, or more specifically, if the source material for the organometal compound is tertiarybutoxyhafnium.

Figure 6:
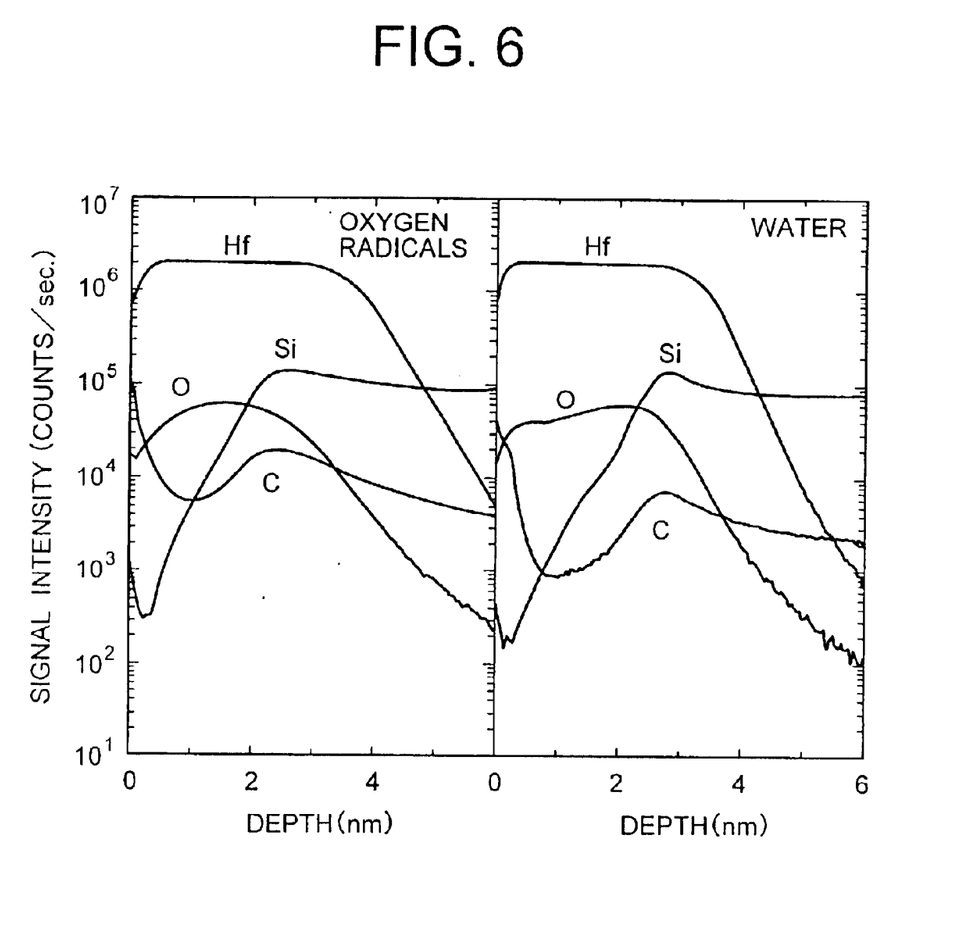
FIG. 6 is an element distribution profile of the films formed by a conventional method and the method of the present invention.

Referring to FIG. 6, the deposited films were subjected to a secondary-ion-mass-spectroscopy, wherein the amount of impurity carbon was measured in the deposited films and plotted against the depth of the measurements. The right graph corresponds to irradiation of oxygen radicals, whereas the left graph corresponds to irradiation of water. As understood from FIG. 6, the residual carbon is reduced by the process using the oxygen radicals compared to the process using water. Thus, it is confirmed that the oxygen radicals significantly reduce the impurities in the deposited film as well as the leakage current in the resultant device.

Figure 7:
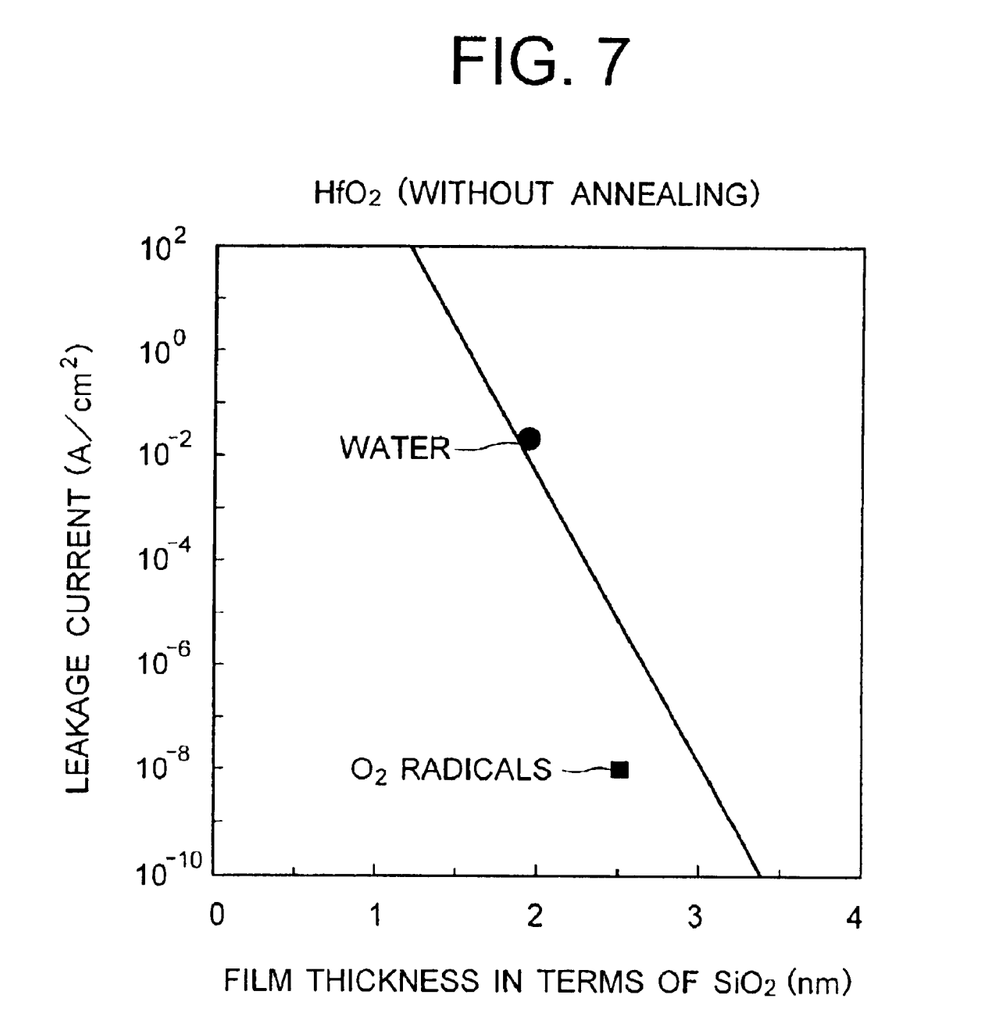
FIG. 7 is a graph showing the relationship between the leakage current and the thickness of a $HfO_2$ film formed by a process of a first example of the present invention.

Referring to FIG. 7, there is shown the electric characteristic of the $HfO_2$ film formed by the ALD technique according to the present example, wherein the leakage current is plotted on ordinate against the film thickness plotted on abscissa in terms of $SiO_2$ thickness. It will be understood from this figure that the leakage current is significantly reduced by the ALD technique using the oxygen radicals compared to the comparative process using water, thereby improving the insulating characteristic of the deposited film in addition to the improvement of the controllability of the film thickness.

It is to be noted that FIG. 7 shows the leakage characteristic of the deposited film just after the deposition thereof without conducting an annealing step. The annealing step, if conducted, may further reduce the leakage current. The annealing step may preferably be conducted under the conditions such that the deposited film is subjected to a thermal processing at a temperature around between 500 and 950 degrees C. in a hydrogen ambient for about ten minutes. The annealing process may be conducted in a vacuum within the same ALD chamber succeeding to the ALD process.

In a semiconductor device having a metal compound film formed according to the above example, it is usual that an annealing step is performed for reducing the interface level of the gate insulating film or for activating the source/drain regions. Thus, the annealing step need not be conducted solely for reduction of the leakage current separately from the annealing step for such a purpose.

The organometal compound may be acetylacetonatehafnium, $Hf(Acac)_4$, or diethylaminohafnium, $Hf(NEt_2)_4$, other than the exemplified tertiarybutoxyde. Tertiaybutoxyzirconium, acetylacetonatezirconium, or diethylaminozirconium may be used as a source material for depositing monoatomic layers of the metal oxide compound.

EXAMPLE #2

The present example is such that the present invention is applied to using a lanthanide material. In the present embodiment, dipivaloylmethanatelanthanum (DPM of lanthanum), $La(C_{11}H_{19}O_2)_3$, is used as a source material for the metal compound. The DPM of lanthanum, which generally assumes the form of white powder at room temperature, was dissolved into butyl acetate at a rate of 0.1 mol./litter to obtain a solution, which was evaporated at a rate of 0.1 gramm/min. and introduced into the deposition chamber 11 via pipe line heated up to a temperature of 200 degrees C. or above. The partial pressure of irradiated DPM of lanthanum was 100 Pa, and the oxygen radicals were generated by applying a power of 10 watts to oxygen gas at a partial pressure of 1 Pa. An 8-inch silicon substrate on which a thermal silicon oxide film had been formed beforehand was used as the substrate 13.

After heating the substrate 13 up to 300 degrees C., alternate irradiation of the source material and oxygen radicals in this order were iterated for 40 cycles to the substrate to form a 3-nm-thick metal oxide film. This allowed deposition of monoatomic layers by saturation absorption, similarly to Example #1, in the case of irradiation for 5 seconds or above at each cycle. The monoatomic layer deposition achieved an excellent in-plane uniformity of the film thickness, wherein a 3-nm-thick lanthanum oxide film was formed at an in-plane uniformity of thickness within variances of ±0.05 nm in the 8-inch wafer. In addition, as in the case of Example #1, the residual carbon in the deposited film was also reduced compared to the comparative process using water.

In the present example, it was also confirmed that the substrate temperature above 350 degrees C. caused autolysis of the deposited source material and prevented the deposition of monoatomic layers. The monoatomic layers of the lanthanum oxide insulating film deposited in the example was not reacted with an overlying polysilicon film during a heat treatment at 1050 degrees C., and did not exhibit degradation of the lanthanum oxide film. The lanthanum in the DPM compound in the insulating film may be replaced by a terbium, erbium, holmium, dysprosium, and praseodymium.

Instead of the oxygen radicals used in the present example, nitrogen radicals obtained from nitrogen gas or ammonium gas may be used, as well as a mixture of oxygen radicals and nitrogen radicals obtained from oxygen nitride gas such as NO, $N_2O$ or $NO_2$ gas. The nitrogen radicals and mixture of nitrogen radicals and oxygen radicals generate a nitriding reaction and an oxidizing-nitriding reaction, respectively, of metal, whereby a metal nitride or metal oxide nitride film can be deposited on a monoatomic layer basis.

EXAMPLE #3

Figure 8:
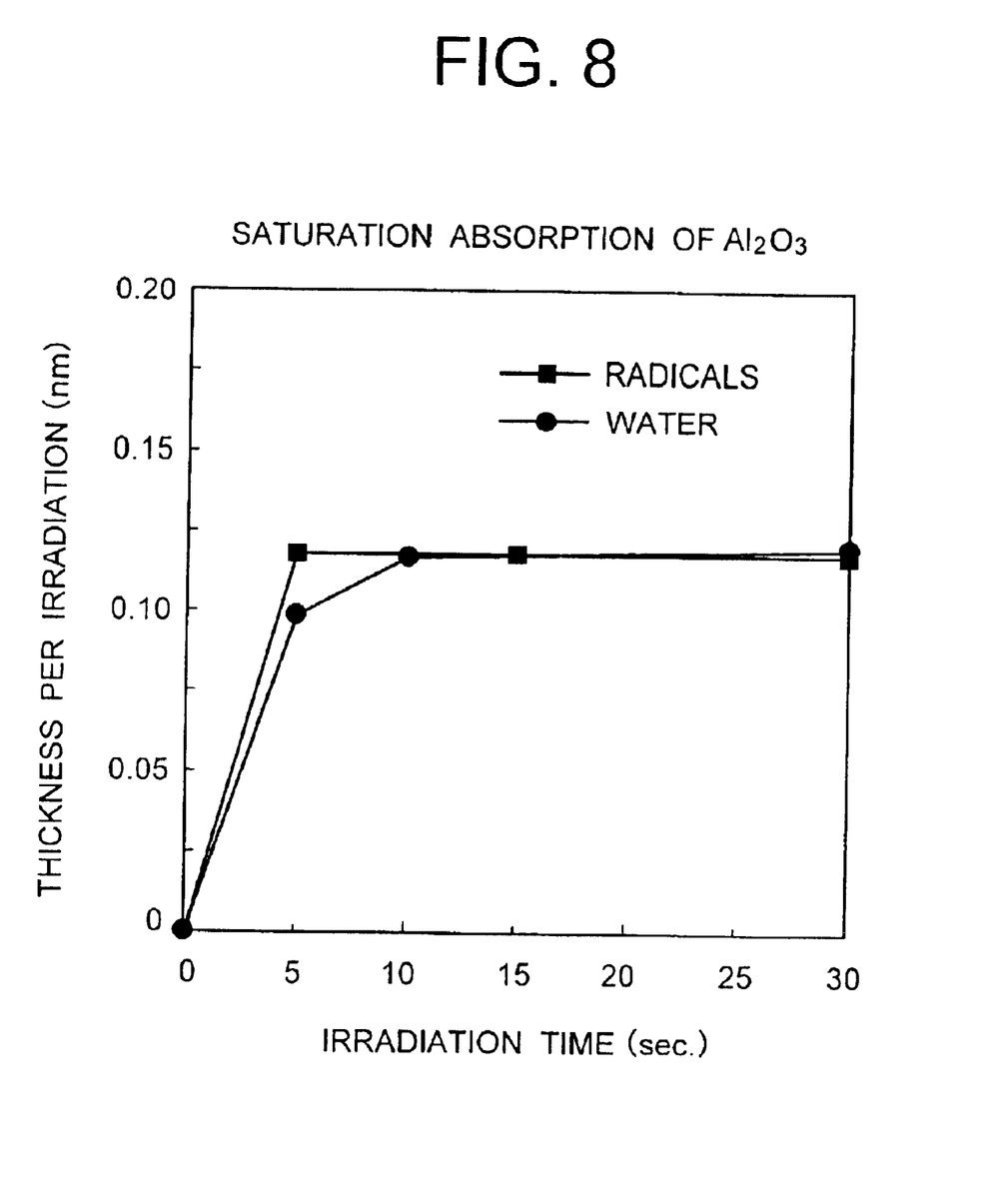
FIG. 8 is a graph showing the relationship between the film thickness and the time length for each irradiation of the source material.
Figure 9:
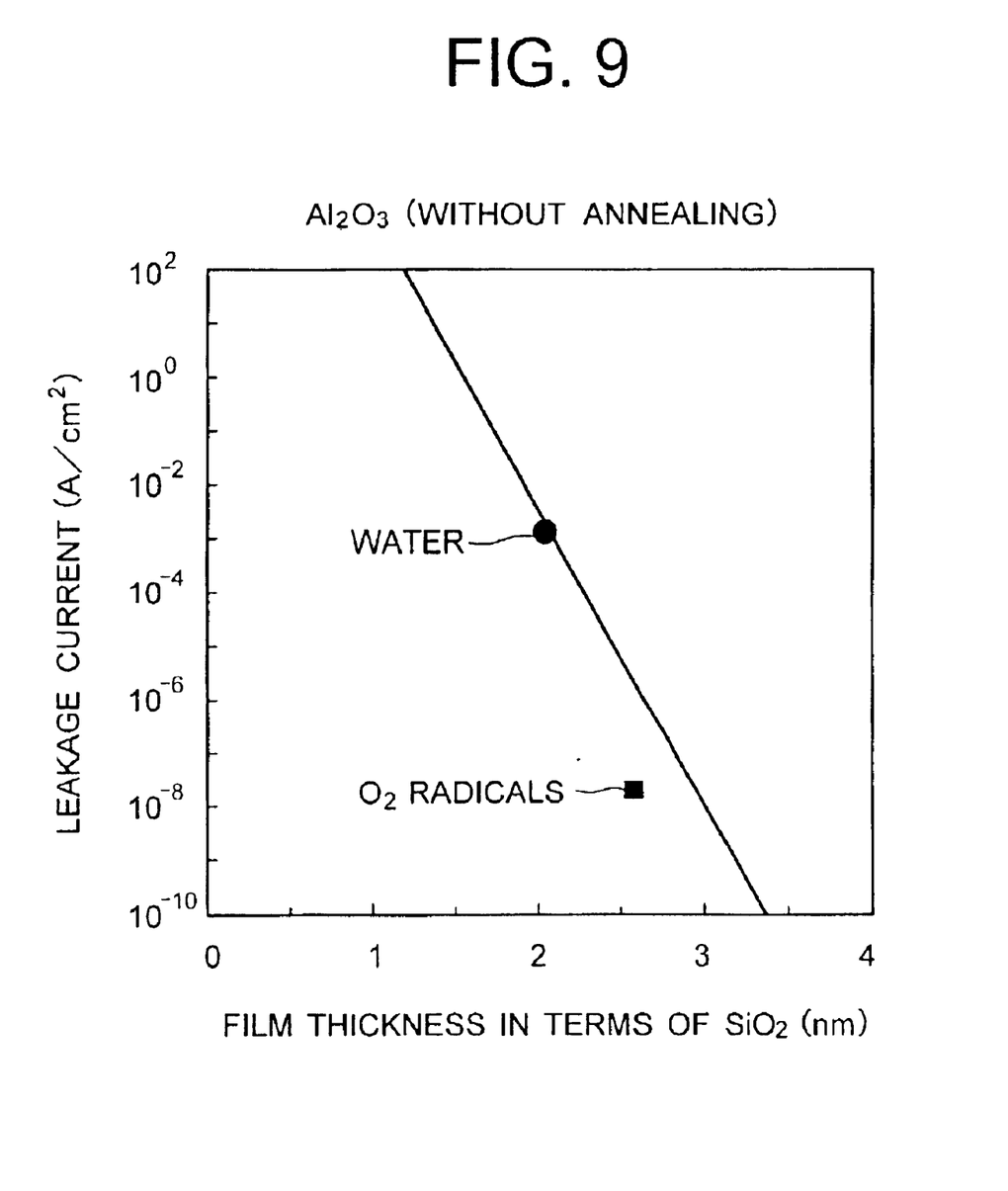
FIG. 9 is a graph showing the relationship between the leakage current and the thickness of an $Al_2O_3$ film formed by a process of a third example of the present invention.

The present example is such that the present invention is applied to deposition of monoatomic layers of $Al_2O_3$ film. FIG. 8 shows the film thickness obtained by alternate irradiation of the source material and oxygen radicals and by alternate irradiation of the source material and water, wherein the film thickness per each irradiation is plotted against the time length for the each irradiation of the source material. FIG. 9 shows the electric characteristics of the resultant $Al_2O_3$ films.

Trimethylaluminum (TMA) was used as the source material for the metal oxide in the present example, and deposited on a 8-inch silicon wafer on which a thermal oxide film having a thickness of 1 nm or less was formed. The source material was heated up to 80 degrees C. beforehand, and then introduced into the deposition chamber 11 via the mass flow controller 16. The partial pressure of irradiated trimethylaluminum was 100 Pa, and oxygen radicals were obtained from oxygen gas having a partial pressure of oxygen at 1 Pa and applied with a power of 10 watts.

After the silicon substrate was heated up to 300 degrees C., alternate irradiation of the source material and oxygen radicals was performed on the silicon substrate for 40 cycles. This provided deposition of monoatomic layers due to saturation absorption in the case of 5 seconds for each irradiation of the source material. On the other hand, alternate irradiation of the source material and water for 40 cycles of irradiation provided saturation absorption in the case of 10 to 15 seconds for each irradiation of the source material.

In the examples #1 and #2 using a source material for hafnium, alternate irradiation of the source material and water did not cause saturation absorption whereas in the example using trimethylaluminum as the source material, alternate irradiation of the source material and water caused saturation absorption. This is considered due to the difference in the source material, wherein trimethylaluminum has a lower reaction capability compared to hafnium and is suppressed to deposit by a CVD process.

It is to be noted that alternate irradiation of the source material and water caused a moderate increase of the film thickness of the deposited film for each irradiation of the source material along with the increase of the time length for each irradiation. Thus, the process using water is considered to be accompanied with a CVD process. On the other hand, the process using oxygen radicals exhibited apparent saturation absorption, whereby the thickness of the deposited monoatomic layers of the metal oxide compound can be strictly controlled. In addition, the oxygen radicals remove the carbon in the organometal compound to improve the electric characteristics of the deposited film compared to the film deposited using water irradiation. Thus, it is concluded that deposition of $Al_2O_3$ using oxygen or nitrogen radicals is superior to that using water.

FIG. 9 is a graph showing the relationship between the leakage current and film thickness in terms of the $SiO_2$ thickness, illustrating the superiority of the process using radicals over the process using water. More specifically, the metal compound film deposited by using the radicals has a lower leakage current per unit thickness compared to the metal compound film deposited using water.

Although an $Al_2O_3$ film can be deposited by saturation absorption by using water, the deposition of $Al_2O_3$ film by using the oxygen radicals can improve the electric characteristics and controllability of the film thickness. It is to be noted that oxygen radicals may also be replaced by nitrogen radicals and a mixture of oxygen radicals and nitrogen radicals in this example.

EXAMPLE #4

Figure 10:
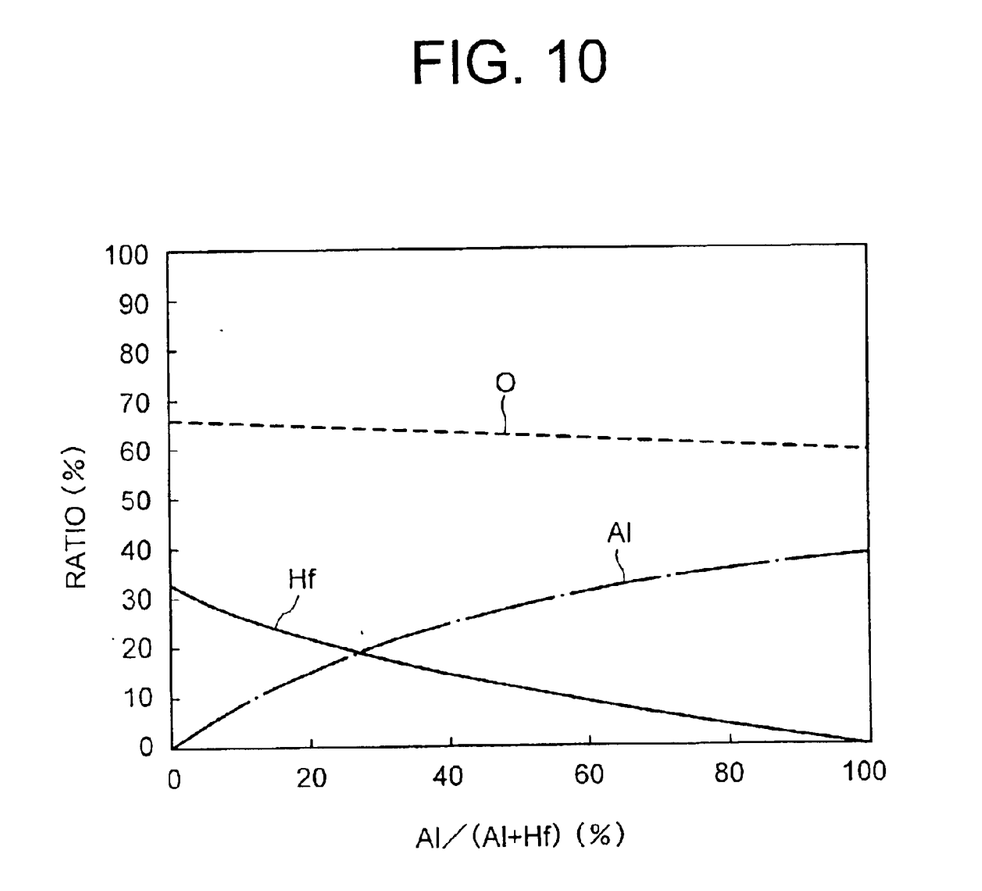
FIG. 10 is a graph showing the relationship between the film composition and flow rate ratio of source materials.

This example is such that the present invention is applied to deposition of hafnium aluminate. FIG. 10 shows the relationship between the composition of the deposited film and the flow rate ratio of Al to a sum of Al and Hf in the source material, the flow rate ratio being obtained by changing the mixing ratio of trimethylaluminum (TMA) and tertiarybutoxyhafnium used as the source materials.

In this example, a mixture of trimethylaluminum and tertiarybutoxyhafnium was used for deposition of a metal compound film, whereas an 8-inch silicon substrate on which a thermal silicon oxide film was formed beforehand was used as a substrate. The partial pressure of the source materials for the organometal compounds was set at 100 Pa in total, whereas oxygen radicals were obtained by applying a power of 100 watts to oxygen gas at a partial pressure of oxygen at 1 Pa.

After heating the substrate up to 300 degrees C., the source material and oxygen radicals were alternately irradiated for 40 cycles, it was confirmed that saturation absorption deposition of monoatomic layers was obtained by irradiation of the source material for a time length of 5 seconds at each irradiation. In the present example, it was also confirmed that a substrate temperature of 350 degrees C. or above caused autolysis of the deposited source material and thus prevented deposition of monoatomic layers.

As shown in FIG. 10, by changing the mixing ratio of the source materials, the composition of the deposited film changed continuously from $Al_2O_3$ to $HfO_2$. Along with the change of the composition, the dielectric constant of the deposited film linearly changed from 9 corresponding to the dielectric constant of $Al_2O_3$ to 30 corresponding to the dielectric constant of $HfO_2$. The deposited insulating film having a hafnium concentration of 50% or less exhibited no crystallization after a heat treatment at 1050 degrees C., and exhibited no reaction with the overlying polysilicon electrode and thus no degradation.

As the source material for hafnium other than tertiarybutoxyed, it was confirmed that acetylacetonatehafnium, $Hf(Acac)_4$, and diethylaminohafnium, $Hf(NEt_2)_4$, exhibited similar results. In addition, by using tertiarybutoxyzirconium, acetylacetatezirconium, diethylaminozirconium as the source material, it was confirmed that zirconium aluminate films could be deposited as monoatomic layers. Further, by replacing trimethylaluminum used in the present example with tetramethylsilane, it was also confirmed that a silicate film containing hafnium or zirconium could be deposited.

EXAMPLE #5

The present example is such that the present invention is applied to continuous deposition of a silicon oxide film and a metal oxide film on an underlying silicon substrate.

First, a native oxide film is removed by diffusing the silicon substrate into a hydrofluoric acid solution, followed by introduction of the silicon substrate into the deposition chamber. Then, the silicon substrate is subjected to an oxidation process while generating oxygen radicals for 5 seconds under the conditions of a substrate temperature at 400 degrees C., a partial pressure of oxygen at 1 Pa and an electric power at 10 watts, whereby a silicon oxide film having a thickness of 1 nm or less is formed on the silicon substrate.

Subsequently, the substrate was cooled down to 300 degrees C. and alternate irradiation of the organometal compound and oxygen radicals were performed for 40 cycles, similarly to the first through fourth examples, whereby a silicon oxide film and a metal oxide insulating film were continuously deposited. Analysis of the deposited films by using a secondary-ion-mass-spectroscopy technique revealed further reduction of the amount of residual carbon, which resulted in further suppression of the leakage current.

Instead of oxygen radicals used in the present example, nitrogen radicals generated from nitrogen gas and ammonia gas were also used for deposition, which resulted in a nitriding reaction of the silicon substrate and the organometal compound to continuously deposit a metal nitride film onto a silicon nitride film. A mixture of radicals generated from a nitrogen oxide gas such as NO, $N_2O$, $NO_2$ gas was also used for deposition resulting in an oxidizing-nitriding reaction of silicon substrate and organometal compound, whereby a metal oxide nitride film was continuously deposited on the silicon oxide nitride film.

In each of the above examples, zirconium, hafnium, aluminum and lanthanide oxides were used for the metal oxide film. However, the present invention can be applied to a wide range of other metals such as tungsten, tantalum and titanium. In addition, although the deposited films were gate insulating films in the above examples, the deposited films may be barrier layers which are generally used in multilayer interconnection films of a silicon integrated circuit for deposition of monoatomic layers, or may be a capacitor insulating films generally used in a DRAM.

The barrier layer as recited above may be, for example, a TiN layer which may be formed by using tetramethylaminotitanium as the organometal compound in combination with nitrogen radicals, or a TaN layer which may be formed by using pentadimethylaminotantalum as the organometal compound in combination with nitrogen radicals.

Since the above embodiments are described only for examples, the present invention is not limited to the above embodiments and various modifications or alterations can be easily made therefrom by those skilled in the art without departing from the scope of the present invention.

What is claimed is:

1. A method for depositing monoatomic layers of a metal compound to form a metal compound film on a substrate, comprising the step of irradiating alternately an organometal compound as a source material and either of oxygen radicals, nitrogen radicals and a mixture of oxygen radicals and nitrogen radicals as an oxidizing or nitriding agent,
wherein said metal compound film is a gate insulating film of a MOSFET.

2. The method as defined in claim 1, wherein said mixture is generated from nitrogen oxide gas including NO, $N_2O$ and/or $NO_2$.

3. The method as defined in claim 1, wherein said irradiating step is performed under the condition that said substrate is maintained at a temperature which does not cause autolysis of said organometal compound.

4. The method as defined in claim 3, wherein said substrate is maintained at a temperature which allows said metal compound film to deposit as an amorphous film.

5. The method as defined in claim 4, wherein said organometal compound is tertiarybutoxyhafnium, and said substrate is maintained at a temperature between room temperature and 300 degrees C.

6. The method as defined in claim 1, wherein said substrate is a silicon substrate, and irradiating oxygen radicals and/or nitrogen radicals is performed prior to irradiating said organometal compound.

7. The method as defined in claim 1, wherein a mixture of plurality of organometal compounds is used as said source material.

8. The method as defined in claim 7, wherein a mixing ratio of said organometal compounds is changed in said mixture to control a composition of said metal compound film.

9. The method as defined in claim 1, wherein said organometal compound includes a compound selected from the group consisting of zirconium, hafnium, lanthanide compounds.

10. The method as defined in claim 1, wherein said organometal compound includes a compound selected from the group consisting of tertiarybutoxyhafnium, acetylacetonatehafnium, diethylaminohafnium, tertiarybutoxyzirconium, acetylacetatezirconium, and diethylaminozirconium.

11. The method as defined in claim 10, wherein said source material further includes trimethylaluminum or tetramethylsilane, and said metal compound film includes aluminate or silicate compound.

12. The method as defined in claim 9, wherein said organometal compound includes a dipivaloylmetanate compound of lanthanum, terbium, erbium, holmium, dysprosium and praseodymium.

13. The method as defined in claim 1, wherein said irradiating step is performed under the condition of a partial pressure of water in a deposition chamber being equal to or below $10^{-4}$ Pa.

* * * * *